United States Patent
Sherbrook et al.

(10) Patent No.: US 11,808,820 B1
(45) Date of Patent: Nov. 7, 2023

(54) FAULT DETECTION FOR REDUNDANT CONNECTIONS

(71) Applicant: APPLE INC., Cupertino, CA (US)

(72) Inventors: Stephen C. Sherbrook, San Jose, CA (US); Alvin K. Ng, San Jose, CA (US); Anthony Da Costa, Los Altos, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/878,952

(22) Filed: Aug. 2, 2022

(51) Int. Cl.
*G01R 31/40* (2020.01)
*G01R 19/00* (2006.01)

(52) U.S. Cl.
CPC ......... *G01R 31/40* (2013.01); *G01R 19/0092* (2013.01)

(58) Field of Classification Search
CPC ............................ G01R 31/40; G01R 19/0092
USPC ......................................... 324/500, 509, 512
See application file for complete search history.

(56) References Cited

U.S. PATENT DOCUMENTS

| | | |
|---|---|---|
| 6,246,557 B1 | 6/2001 | Bayer et al. |
| 6,560,079 B1 | 5/2003 | Hirsh et al. |
| 8,013,612 B2 | 9/2011 | Morini et al. |
| 8,841,917 B2 | 9/2014 | Wei et al. |
| 9,046,560 B2 | 6/2015 | Li |
| 9,383,399 B2 | 7/2016 | Wei et al. |
| 9,519,016 B2 | 12/2016 | Satoh et al. |
| 9,548,627 B1* | 1/2017 | King, Jr. ................. G06F 11/24 |
| 9,843,221 B1 | 12/2017 | Kim et al. |
| 9,892,570 B2 | 2/2018 | Tornare et al. |
| 10,374,444 B2 | 8/2019 | Worry et al. |
| 11,067,640 B2 | 7/2021 | Ruiz-Garcia et al. |
| 2014/0092500 A1 | 4/2014 | Givelin et al. |
| 2015/0355260 A1 | 12/2015 | Franchini et al. |
| 2016/0274195 A1* | 9/2016 | Collins .................. G01R 31/40 |
| 2022/0107363 A1* | 4/2022 | Ewanchuk ....... G01R 31/31924 |

* cited by examiner

*Primary Examiner* — Giovanni Astacio-Oquendo
(74) *Attorney, Agent, or Firm* — Young Basile Hanlon & MacFarlane, P.C.

(57) ABSTRACT

A system includes a first connection configured to allow current flow between a first node and a second node through a first transistor when it is enabled, and a first diode configured to allow current flow between the first node and the second node when the first transistor is disabled. A second connection is configured to allow current flow between the first node and the second node through a second transistor when it is enabled, and a second diode configured to allow current flow between the first node and the second node when the second transistor is disabled. A fault detection circuit is configured to test the first connection by detection of current flow on the second connection with the second transistor disabled, and is configured to test the second connection by detection of current flow on the first connection with the first transistor disabled.

24 Claims, 4 Drawing Sheets

FAULT DETECTION FOR REDUNDANT CONNECTIONS

FIELD

The present disclosure relates generally to the field of fault detection for redundant connections.

BACKGROUND

Some electrical systems benefit from high levels of redundancy. Such systems may incorporate redundant connections, such as redundant power supply connections and redundant grounding connections.

SUMMARY

One aspect of the disclosure is a system that includes a first connection from a first node to a second node, the first connection including a first transistor and a first diode in parallel with the first transistor. The first transistor is configured to allow current flow between the first node and the second node through the first transistor when the first transistor is enabled, and the first diode is configured to allow current flow between the first node and the second node when the first transistor is disabled. A second connection from the first node to the second node includes a second transistor and a second diode in parallel with the second transistor. The second transistor is configured to allow current flow between the first node and the second node through the second transistor when the second transistor is enabled, and the second diode is configured to allow current flow between the first node and the second node when the second transistor is disabled. A fault detection circuit is configured to test the first connection by detection of current flow along the second connection while the second transistor is disabled, and is configured to test the second connection by detection of current flow along the first connection while the first transistor is disabled.

Another aspect of the disclosure is a system that includes a first connection from a first node to a second node, and a second connection from the first node to the second node. The first connection includes a first MOSFET having a first body diode, and a first external diode that is anti-parallel to the first body diode. The first MOSFET is switchable between an enabled state, in which current flows through the first MOSFET between the first node and the second node, and a disabled state, in which current does not flow through the first MOSFET between the first node and the second node. The second connection includes a second MOSFET having a second body diode, and a second external diode that is anti-parallel to the second body diode. The second MOSFET is switchable between an enabled state, in which current flows through the second MOSFET between the first node and the second node, and a disabled state, in which current does not flow through the second MOSFET between the first node and the second node. A fault detection circuit is configured to test the first connection by detection of a voltage drop having a magnitude in excess of a threshold value along the second connection when the second MOSFET is in the disabled state. The fault detection circuit is configured to test the second connection by detection a voltage drop having a magnitude in excess of the threshold value along the first connection when the first MOSFET is in the disabled state.

Another aspect of the disclosure is a method for detecting a fault of a first connection between a first node and a second node. The method includes switching a transistor of a second connection between the first node and the second node from an enabled state to a disabled state, determining that a current flow is present across a diode of the second connection while the transistor of the second connection is in the disabled state, and in response to determining that the current flow is present, outputting a signal indicative of a fault of the first connection.

Another aspect of the disclosure is a system that includes a first connection from a first node to a second node, a second connection from the first node to the second node, and a fault detection circuit. The first connection includes a first switching device and a first voltage drop circuit in parallel with the first switching device, wherein the first switching device is configured to allow current flow between the first node and the second node through the first switching device when the first switching device is enabled, and the first voltage drop circuit is configured to allow current flow between the first node and the second node when the first switching device is disabled. The second connection includes a second switching device and a second voltage drop circuit in parallel with the second switching device, wherein the second switching device is configured to allow current flow between the first node and the second node through the second switching device when the second switching device is enabled, and the second voltage drop circuit is configured to allow current flow between the first node and the second node when the second switching device is disabled. The fault detection circuit is configured to test the first connection by detection of current flow along the second connection while the second switching device is disabled, and configured to test the second connection by detection of current flow along the first connection while the first switching device is disabled.

DETAILED DESCRIPTION

The disclosure herein relates to fault detection for redundant connections, such as redundant connections of circuit to a power supply, or redundant connections of a circuit to a ground (e.g., a unified ground). Redundant connections are sometimes used for systems that benefit from a high level of reliability, such as power and water utilities, telecommunications systems, datacenter equipment, aircraft, and automobiles. When these types of redundant connections are used, a system may continue operating normally when one of the connections is rendered inoperable, because the connection is maintained by another one of the multiple redundant connections.

The fault detection circuits that are described herein may be used to determine whether a single connection among two or more redundant connections has been rendered inoperable, such as by disconnection or damage to the connection. These fault detection circuits may be applied, for example, to systems in which comparing the current carried by two or more redundant connections is unreliable, such as when the current is highly dynamic, the current has a high crest factor, or the current is not split evenly among the redundant connections.

Figure 1:
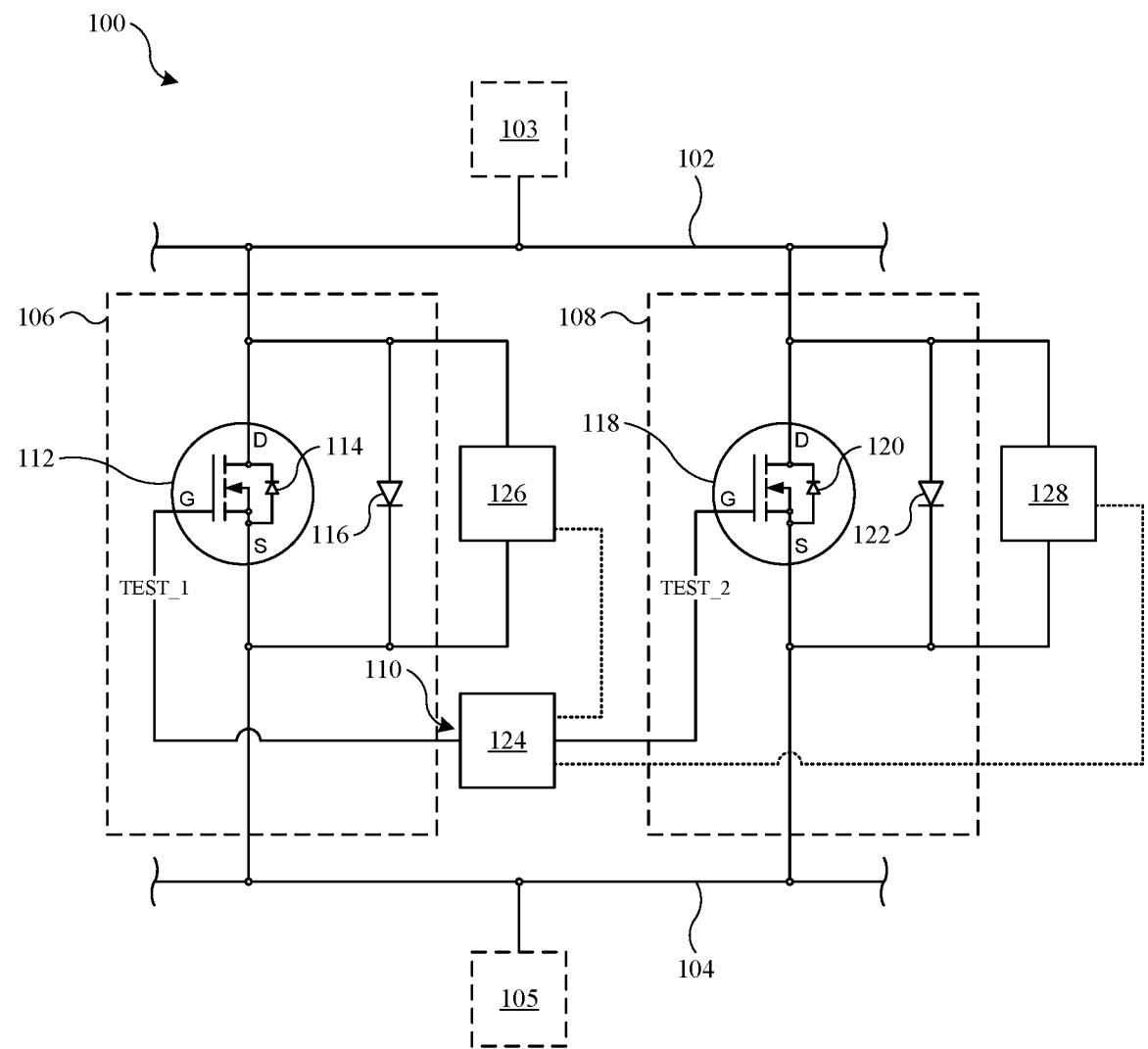
FIG. 1 is an illustration of a system for fault detection according to a first example.

FIG. 1 is an illustration of a system 100 for fault detection. The system includes a first node 102 and a second node 104. The system 100 includes redundant connections from the first node 102 to the second node 104. In the illustrated implementation, the redundant connections include a first connection 106 from the first node 102 to the second node 104, and a second connection 108 from the first node 102 to the second node 104. Under normal and expected operating conditions (e.g., in the absence of a fault), both of the first connection 106 and the second connection 108 function as electrical connections (e.g., current-carrying connections) between the first node 102 and the second node 104. It is possible that either or both of the first connection 106 and the second connection 108 may experience a fault that renders the first connection 106 and/or the second connection 108 inoperable, such that the respective one of the connections is no longer able to function as an electrical connection between the first node 102 and the second node 104. In order to determine whether a fault has occurred, the system 100 includes a fault detection circuit 110. The fault detection circuit 110 is configured to determine whether either of the first connection 106 or the second connection 108 has experienced a fault that has rendered it inoperable, by independently testing the first connection 106 and the second connection 108 as will be described herein.

The first node 102 and the second node 104 are components that are interconnected in a redundant manner by the first connection 106 and the second connection 108. The first node 102 and the second node 104 may, in some implementations, be connected to a first external component 103 and a second external component 105, respectively, or may be portions of the first external component 103 and the second external component 105. As one example, the first connection 106 and the second connection 108 may be implemented as redundant ground connections that connect an external circuit to a unified ground. In this example, the first node 102 is configured for connection to a grounding node of an external circuit, represented by the first external component 103, and the second node 104 is a ground, represented by the second external component 105. As another example, the first connection 106 and the second connection 108 may be implemented as redundant power supply connections that connect an external circuit to a single voltage source. In some implementations, the first node 102 is configured for connection to a voltage source and the second node 104 is configured for connection to a source node of an external circuit.

The first connection 106 includes a first transistor 112. The first transistor 112 defines a primary current-carrying path of the first connection 106, by which current flows along the first connection 106 during normal operation (e.g., in the absence of a fault and when fault testing is not occurring). The first transistor 112 is connected between the first node 102 and the second node 104 to define a switched path (e.g., a first switched path) for current flow between the first node 102 and the second node 104. As an example, one of the source terminal S or the drain terminal D of the first transistor 112 is connected (directly or through another component) to the first node 102, and the other of the source terminal S or the drain terminal D of the first transistor 112 is connected (directly or through another component) to the second node 104. In the illustrated implementation, the drain terminal D of the first transistor 112 is connected to the first node 102 and the source terminal S of the first transistor 112 is connected to the second node 104, and the first transistor 112 is configured to allow current to flow from the first node 102 to the second node 104 by flow through the first transistor 112 from the drain terminal D to the source terminal S.

The first transistor 112 is switchable between an enabled state and a disabled state. In the enabled state, the first transistor 112 closes a connection through the first transistor 112 between the first node 102 and the second node 104, and current flows normally between the source terminal S and the drain terminal D. In the disabled state, the first transistor 112 opens the connection through the first transistor 112 between the first node 102 and the second node 104, and current does not flow (aside from leakage current) between the source terminal S and the drain terminal D. The enabled state of the first transistor 112 may be referred to as a closed state or an "on" state, and the disabled state of the first transistor 112 may be referred to as an open state or an "off" state.

The first transistor 112 is switched between the enabled state and the disabled state according to the state of a first test signal TEST_1 that is applied to the gate terminal G of the first transistor 112. In an example, the first transistor 112 is in the enabled state when a magnitude of the first test signal TEST_1 (e.g., a voltage value) is above a threshold value (e.g., a threshold voltage value), and the first transistor 112 is in the disabled state when the magnitude of the first test signal TEST_1 is below the threshold value. It should be understood that the first transistor 112 may be implemented such that this operation is reversed.

The first transistor 112 includes a first body diode 114 (e.g., a first diode of the first transistor 112) that allows current flow opposed to that of current flow through the first transistor 112 between the drain terminal D and the source terminal S when the first transistor 112 is enabled. In the illustrated implementation, the first body diode 114 allows current flow from the second node 104 to the first node 102. It should be understood that directionality of the first body diode 114 is dependent on the configuration selected for the first transistor 112 and may vary accordingly. The first connection 106 could be implemented such that the function of the first body diode 114 of the first transistor 112 is instead performed by a separate component, such as a diode that is separate from the first transistor 112.

The first transistor 112 may be a metal-oxide-semiconductor field-effect transistor (MOSFET), and thus may be referred to as a first MOSFET. In the illustrated implementation, the first transistor 112 is an n-channel enhancement mode MOSFET. It should be understood that other implementations are possible. In addition, the first transistor 112 may be implemented using a MOSFET having a low drain-source on resistance, in order to minimize losses during normal operation of the first connection 106.

The first connection 106 also includes a first external diode 116 (e.g., a non-body diode, which may also be referred to as a first diode) in parallel with the first transistor 112. The first external diode 116 is connected so that current flow through the first external diode 116 is in the same direction as current flow through the first transistor 112 between the source and drain terminals thereof. Thus, the first body diode 114 of the first transistor 112 is anti-parallel (e.g., connected anti-parallel) to the first external diode 116. As used herein, "anti-parallel" means that components are connected in parallel with their polarities reversed with respect to each other. Together, the first external diode 116 and the first body diode 114 allow bi-directional current flow between the first node 102 and the second node 104 along the first connection 106 when the first transistor 112 is disabled. Thus, current flows through the first connection 106 between the first node 102 and the second node 104 through the first transistor 112 when the first transistor 112 is enabled, and the first body diode 114 and the first external diode 116 are configured to allow current flow between the first node 102 and the second node 104 when the first transistor 112 is disabled. A voltage drop associated with this bi-directional current flow may be utilized during testing to determine whether the second connection 108 is operable, as will be described herein.

Some implementations may not require bi-directional current flow. In such implementations, one of the first body diode 114 or the first external diode 116 may be omitted. As an example, the first body diode 114 may be omitted by replacing the first transistor 112 with a switching device that does not include a body diode. The same configuration can be employed for the second connection 108 is bi-directional current flow is not required.

The second connection 108 includes a second transistor 118. The second transistor 118 defines a primary current-carrying path of the second connection 108, by which current flows along the second connection 108 during normal operation (e.g., in the absence of a fault and when fault testing is not occurring). The second transistor 118 is connected between the first node 102 and the second node 104 to define a switched path (e.g., a second switched path) for current flow between the first node 102 and the second node 104. As an example, one of the source terminal S or the drain terminal D of the second transistor 118 is connected (directly or through another component) to the first node 102, and the other of the source terminal S or the drain terminal D of the second transistor 118 is connected (directly or through another component) to the second node 104. In the illustrated implementation, the drain terminal D of the second transistor 118 is connected to the first node 102 and the source terminal S of the second transistor 118 is connected to the second node 104, and the second transistor 118 is configured to allow current to flow from the first node 102 to the second node 104 by flow through the second transistor 118 from the drain terminal D to the source terminal S.

The second transistor 118 is switchable between an enabled state and a disabled state. In the enabled state, the second transistor 118 closes a connection through the second transistor 118 between the first node 102 and the second node 104, and current flows normally between the source terminal S and the drain terminal D. In the disabled state, the second transistor 118 opens the connection through the second transistor 118 between the first node 102 and the second node 104, and current does not flow (aside from leakage current) between the source terminal S and the drain terminal D. The enabled state of the second transistor 118 may be referred to as a closed state or an "on" state, and the disabled state of the second transistor 118 may be referred to as an open state or an "off" state.

The second transistor 118 is switched between the enabled state and the disabled state according to the state of a second test signal TEST_2 that is applied to the gate terminal G of the second transistor 118. In an example, the second transistor 118 is in the enabled state when a magnitude of the second test signal TEST_2 (e.g., a voltage value) is above a threshold value (e.g., a threshold voltage value), and the second transistor 118 is in the disabled state when the magnitude of the second test signal TEST_2 is below the threshold value. It should be understood that the second transistor 118 may be implemented such that this operation is reversed.

The second transistor 118 includes a second body diode 120 (e.g., a body diode of the second transistor 118) that allows current flow opposed to that of current flow through the second transistor 118 between the drain terminal D and the source terminal S when the second transistor 118 is enabled. In the illustrated implementation, the second body diode 120 allows current flow from the second node 104 to the first node 102. It should be understood that directionality of the second body diode 120 is dependent on the configuration selected for the second transistor 118 and may vary accordingly. The second connection 108 could be implemented such that the function of the second body diode 120 of the second transistor 118 is instead performed by a separate component, such as a diode that is separate from the second transistor 118.

The second transistor 118 may be a metal-oxide-semiconductor field-effect transistor (MOSFET), and thus may be referred to as a second MOSFET. In the illustrated implementation, the second transistor 118 is an n-channel enhancement mode MOSFET. It should be understood that other implementations are possible. In addition, the second transistor 118 may be implemented using a MOSFET having a low drain-source on resistance, in order to minimize losses during normal operation of the second connection 108.

The second connection 108 also includes a second external diode 122 (e.g., a non-body diode, which may also be referred to as a second diode) in parallel with the second transistor 118. The second external diode 122 is connected so that current flow through the second external diode 122 is in the same direction as current flow through the second transistor 118 between the source and drain terminals thereof. Thus, the second body diode 120 of the second transistor 118 is anti-parallel (e.g., connected anti-parallel) to the second external diode 122. Together, the second external diode 122 and the second body diode 120 allow bi-directional current flow between the first node 102 and the second node 104 along the second connection 108 when the second transistor 118 is disabled. Thus, current flows through the second connection 108 between the first node 102 and the second node 104 through the second transistor 118 when the second transistor 118 is enabled, and the second body diode 120 and the second external diode 122 are configured to allow current flow between the first node 102 and the second node 104 when the second transistor 118 is disabled. A voltage drop associated with this bi-directional current flow may be utilized during testing to determine whether the first connection 106 is operable, as will be described herein.

The fault detection circuit 110 configured to test the first connection 106 and the second connection 108. In the illustrated implementation, the fault detection circuit 110 includes a detection controller 124, a first voltage sensor 126, and a second voltage sensor 128.

The detection controller 124 of the fault detection circuit 110 may be a circuit, a microcontroller-implemented device, or other device that is configured to control fault detection functions performed by the fault detection circuit 110. In some implementations, the detection controller 124 is implemented using components such as logic gates that are configured to implement testing functions of the fault detection circuit 110. In some implementations, the detection controller 124 includes a processor that is provided with computer-interpretable program instructions (e.g., stored in a memory that is associated with the processor), wherein the computer-interpretable program instructions, when executed, cause the processor to perform testing functions of the fault detection circuit 110. Other implementations are possible.

The detection controller 124 is operably connected to the gate terminal G of the first transistor 112 to provide the first test signal TEST_1 to the first transistor 112 and thereby control switching of the first transistor 112 between the enabled state and the disabled state. Thus, the detection controller 124 of the fault detection circuit 110 is configured to switch operation of the first transistor 112 between the enabled state and the disabled state. Similarly, the detection controller 124 is operably connected to the gate terminal G of the second transistor 118 to provide the second test signal TEST_2 to the second transistor 118 and thereby control switching of the second transistor 118 between the enabled state and the disabled state. Thus, the detection controller 124 of the fault detection circuit 110 is configured to switch operation of the second transistor 118 between the enabled state and the disabled state.

The first voltage sensor 126 is connected to the first connection 106 in a manner that allows the first voltage sensor 126 to detect a voltage drop across a portion of the first connection 106. The voltage drop that the first voltage sensor 126 is configured to sense is associated with current flow through the first connection 106 when the first transistor 112 is disabled. As an example, the voltage drop that the first voltage sensor 126 is configured to sense may be a forward voltage of the first body diode 114 (e.g., a voltage drop across the first body diode 114) and/or a forward voltage of the first external diode 116 (e.g., a voltage drop across the first external diode 116). As an example, the first voltage sensor 126 may be connected in parallel with the first transistor 112, the first body diode 114, and/or the first external diode 116.

The second voltage sensor 128 is connected to the second connection 108 in a manner that allows the second voltage sensor 128 to detect a voltage drop across a portion of the second connection 108. The voltage drop that the second voltage sensor 128 is configured to sense is associated with current flow through the second connection 108 when the second transistor 118 is disabled. As an example, the voltage drop that the second voltage sensor 128 is configured to sense may be a forward voltage of the second body diode 120 (e.g., a voltage drop across the second body diode 120) and/or a forward voltage of the second external diode 122 (e.g., a voltage drop across the second external diode 122). As an example, the second voltage sensor 128 may be connected in parallel with the second transistor 118, the second body diode 120, and/or the second external diode 122.

The first voltage sensor 126 and the second voltage sensor 128 may be implemented using a suitable voltage sensing circuit. As one example, the first voltage sensor 126 and the second voltage sensor 128 may each be implemented using an operational amplifier that outputs a signal that represents a comparison of a sensed voltage to a threshold voltage that is defined by reference voltage signal that is provided as an input to the operational amplifier. Other voltage sensing circuits may be used. In addition, voltage sensing may be implemented using circuit configurations and connection locations that differ from those shown and described herein, while still performing the same sensing function.

The fault detection circuit 110 is configured to test the first connection 106 by switching the second transistor 118 to the disabled state and detecting current flow along the second connection 108. Disabling the second transistor 118 temporarily disrupts normal operation of the second connection 108. After fault detection is completed, the second transistor 118 switched back to the enabled state to restore normal operation of the second connection 108.

When the second transistor 118 is disabled (e.g., under control of the detection controller 124), the first connection 106 should provide a low resistance path between the first node 102 and the second node 104 through the first transistor 112 (e.g., between the source terminal S and the drain terminal D thereof) if the first connection 106 is operable. The low resistance path defined through the first transistor 112 prevents current flow between the first node 102 and the second node 104 through the second body diode 120 and the second external diode 122 of the second connection 108, and the second voltage sensor 128 is shorted, therefore registering a voltage of zero volts, which is less than a threshold value at which the second voltage sensor 128 would cause the fault detection circuit 110 to output a signal indicative of a fault. If the first connection 106 is inoperable, for example, because it is disconnected or damaged, the first connection 106 does not provide a current path between the first node 102 and the second node 104 when the second transistor 118 is disabled, and current instead flows through the second body diode 120 and/or the second external diode 122. Current flow through the second body diode 120 and/or the second external diode 122 causes a voltage drop (e.g., a forward voltage of the second body diode 120 and/or the second external diode 122). This voltage drop is measured by the second voltage sensor 128, for example, by comparison with a threshold value defined by a reference voltage signal, and the detection controller 124 outputs a signal indicative of a fault (e.g., indicating that a fault of the first connection 106 has been detected).

The expected magnitude of the voltage drop on the second connection 108 (e.g., across the second body diode 120 and/or the second external diode 122) when a fault of the first connection 106 is present is approximately 0.3 volts to 0.7 volts. Thus, the second voltage sensor 128 may be configured to output the signal indicative of the fault when the magnitude of the voltage drop is in excess of 0.3 volts, for example, by comparison of the voltage drop on the second connection 108 to a reference signal of 0.3 volts. In other implementations, a different threshold value may be used, and a fault can be indicated when the voltage drop is in excess of zero volts, in excess of 0.1 volts, in excess of 0.2 volts, etc.

The fault detection circuit 110 is configured to test the second connection 108 by switching the first transistor 112 to the disabled state and detecting current flow along the first connection 106. Disabling the first transistor 112 temporarily disrupts normal operation of the first connection 106. After fault detection is completed, the first transistor 112 is switched back to the enabled state to restore normal operation of the first connection 106.

When the first transistor 112 is disabled (e.g., under control of the detection controller 124), the second connection 108 should provide a low resistance path between the first node 102 and the second node 104 through the second transistor 118 (e.g., between the source terminal S and the drain terminal D thereof) if the second connection 108 is operable. The low resistance path defined through the second transistor 118 prevents current flow between the first node 102 and the second node 104 through the first body diode 114 and the first external diode 116 of the first connection 106, and the first voltage sensor 126 is shorted, therefore registering a voltage of zero volts, which is less than a threshold value at which the first voltage sensor 126 would cause the fault detection circuit 110 to output a signal indicative of a fault. If the second connection 108 is inoperable, for example, because it is disconnected or damaged, the second connection 108 does not provide a current path between the first node 102 and the second node 104 when the first transistor 112 is disabled, and current instead flows through the first body diode 114 and/or the first external diode 116. Current flow through the first body diode 114 and/or the first external diode 116 causes a voltage drop (e.g., a forward voltage of the first body diode 114 and/or the first external diode 116). This voltage drop is measured by the first voltage sensor 126, for example, by comparison with a threshold value defined by a reference voltage signal, and the detection controller 124 outputs a signal indicative of a fault (e.g., indicating that a fault of the second connection 108 has been detected).

The expected magnitude of the voltage drop on the first connection 106 (e.g., across the first body diode 114 and/or the first external diode 116) when a fault of the second connection 108 is present is approximately 0.3 volts to 0.7 volts. Thus, the second voltage sensor 128 may be configured to output the signal indicative of the fault when the magnitude of the voltage drop is in excess of 0.3 volts, for example, by comparison of the voltage drop on the second connection 108 to a reference signal of 0.3 volts. In other implementations, a different threshold value may be used, and a fault can be indicated when the voltage drop is in excess of zero volts, in excess of 0.1 volts, in excess of 0.2 volts, etc.

Thus, the fault detection circuit 110 may be configured to test the first connection 106 by detection of current flow along the second connection 108 while the second transistor 118 is disabled, and configured to test the second connection 108 by detection of current flow along the first connection 106 while the first transistor 112 is disabled. The fault detection circuit 110 may be configured to output a signal indicative of a fault of the first connection 106 upon detection of current flow through one of the second body diode 120 or the second external diode 122 of the second connection 108, because current flow through the second body diode 120 or the second external diode 122 while the second transistor 118 is disabled indicates a fault of the first connection 106. The fault detection circuit 110 may be configured to output a signal indicative of a fault of the second connection 108 upon detection of current flow through one of the first body diode 114 or the first external diode 116 of the first connection 106, because current flow through the first body diode 114 or the first external diode 116 while the first transistor 112 is disabled indicates a fault of the second connection 108. The fault detection circuit 110 may be configured to detect the current flow through the second body diode 120 or the second external diode 122 by detection of a voltage drop across the second body diode 120 or the second external diode 122 using the second voltage sensor 128, and the fault detection circuit 110 may be configured to detect the current flow through the first body diode 114 or the first external diode 116 by detection of a voltage drop across the first body diode 114 or the first external diode 116 using the first voltage sensor 126. As an example the fault detection circuit 110 may be configured to output a signal indicative of a fault upon detection of a voltage drop having a magnitude in excess of a threshold value, such as 0.3 volts, wherein the detected fault is a fault of the first connection 106 when the voltage drop is detected across the second body diode 120 or the second external diode 122 of the second connection 108, and the detected fault is a fault of the second connection 108 when the voltage drop is detected across the first body diode 114 or the first external diode 116 of the first connection 106.

The system 100 may be used to implement a method for detecting a fault of a first connection 106 between the first node 102 and the second node 104. The method includes switching the second transistor 118 of the second connection 108 from the enabled state to the disabled state, and determining that a current flow is present across the second body diode 120 and/or the second external diode 122 of the second connection 108 while the second transistor 118 of the second connection 108 is in the disabled state. Determining that the current flow is present may comprise detecting a voltage drop across the second body diode 120 and/or the second external diode 122 of the second connection 108 while the second transistor 118 of the second connection 108 is in the disabled state, the voltage drop having a magnitude in excess of a threshold value, such as 0.3 volts. The voltage drop may be measured using the second voltage sensor 128. In response to determining that the current flow is present, the method includes outputting a signal indicative of a fault of the first connection 106, for example, by the detection controller 124 of the fault detection circuit 110. An equivalent method may be employed to detect a fault of the second connection 108, by disabling the first transistor 112 of the first connection 106, and measuring a voltage drop using the first voltage sensor 126.

Figure 2:
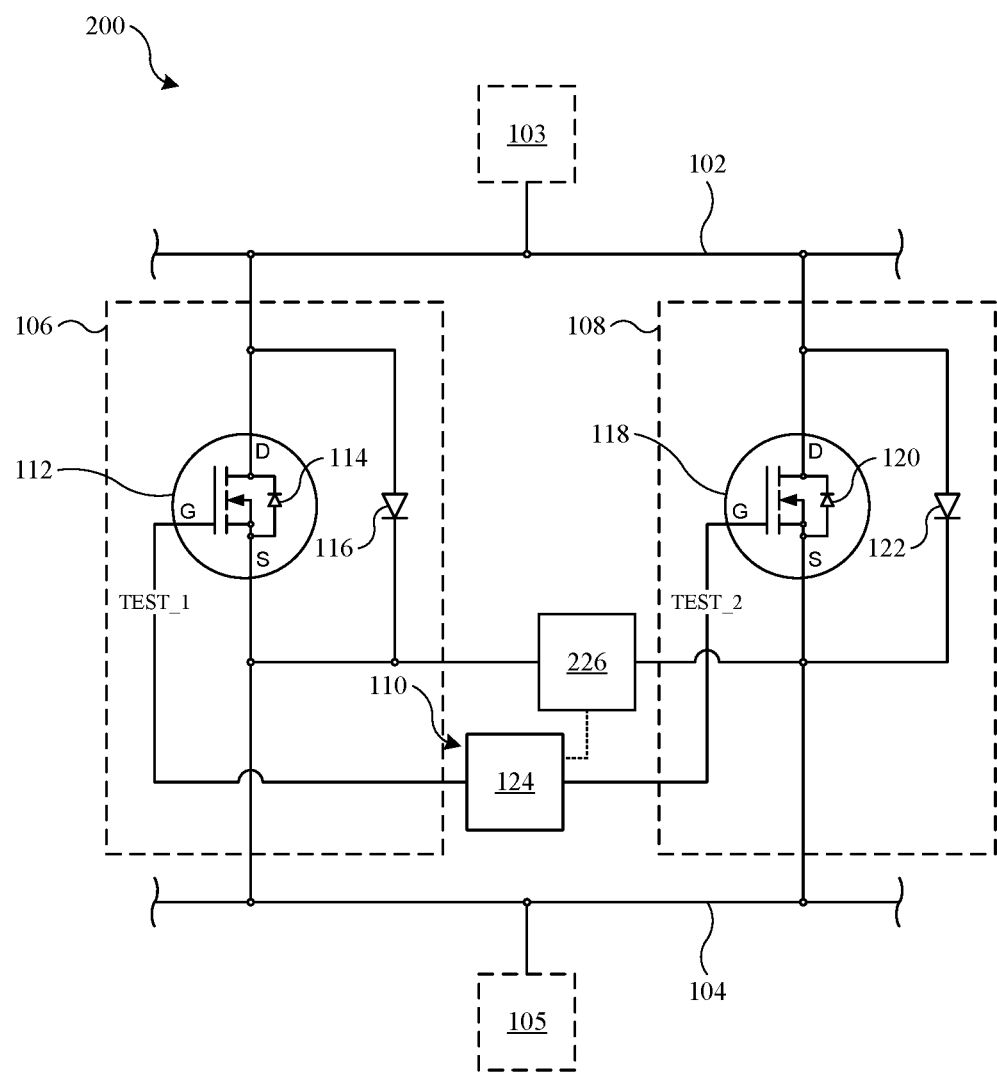
FIG. 2 is an illustration of a system for fault detection according to a second example.

FIG. 2 is an illustration of a system 200 for fault detection in which the first voltage sensor 126 and the second voltage sensor 128 are omitted in favor of a voltage sensor 226. Otherwise, the system 200 is implemented in the same manner as the system 100 and may include all components from the system 100, which are implemented in the manner previously described. The voltage sensor 226 is connected to the detection controller 124, and is configured to detect a voltage difference between the first connection 106 and the second connection 108. The voltage sensor 226 is connected to portions of the first connection 106 and the second connection 108. As an example, the voltage sensor 226 is connected to the source terminal of the first transistor 112 and to the source terminal of the second transistor 118 in the illustrated implementation.

During normal operation of the system 100 the voltage difference that is detected by the voltage sensor 226 is approximately zero, and an absolute value of the voltage difference is therefore below a threshold magnitude that is indicative of a fault. During fault testing of the first connection 106 or the second connection 108, when no fault is present, the voltage difference that is detected by the voltage sensor 226 is approximately zero, and an absolute value of the voltage difference is therefore below a threshold magnitude that is indicative of a fault. During fault testing of the first connection 106 or the second connection 108, when a fault is present, the voltage difference that is detected by the voltage sensor 226 is a positive or negative voltage value that has an absolute value (e.g., a magnitude) that is above threshold magnitude that is indicative of a fault. The polarity of the voltage value may correspond to the connection being tested.

Figure 3:
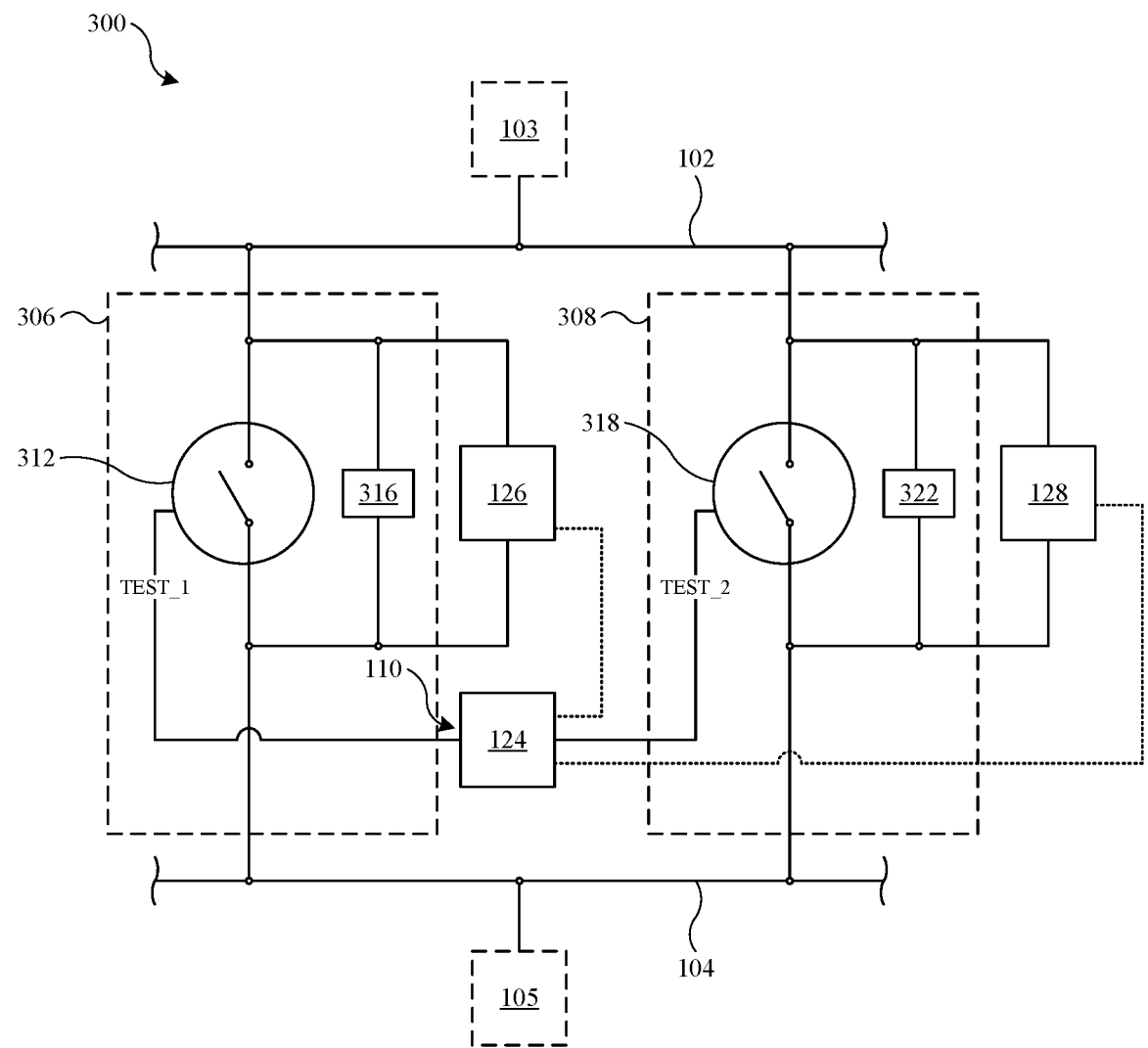
FIG. 3 is an illustration of a system for fault detection according to a third example.

FIG. 3 is an illustration of a system 300 for fault detection, which is a generalized implementation of the system 100. The system 300 is implemented in the same manner as the system 100 and may include all components from the system 100. The previous description of the system 100 an its components is applicable to the system 300 except as stated to the contrary herein. In the system 300, the first connection 106 and the second connection 108 are replaced by a first connection 306 and a second connection 308. The first connection 306 and the second connection 308 function in the manner described with respect to the first connection 106 and the second connection 108, and are usable for fault detection in a similar manner.

The first connection 306 includes a first switching device 312 and a first voltage drop circuit 316. The first switching device 312 replaces the first transistor 112 of the first connection 106, and is normally closed (e.g., during normal operation) in order to allow current flow between the first node 102 and the second node 104. The first switching device 312 is a switching device of any suitable type that can be controlled by the detection controller 124 of the fault detection circuit 110, such as a relay or any type of transistor, with or without a body diode. The first switching device 312 may be implemented according to the description of the first transistor 112. The first switching device 312 is closed during normal operation and is open during fault testing of the second connection 308.

The first body diode 114 and the first external diode 116 of the first connection 106 are omitted in the first connection 306 and are replaced by a voltage drop circuit 316. The voltage drop circuit 316 is a unidirectional or bidirectional current path that is parallel to the first switching device 312. The voltage drop circuit 316 may be or include, for example, one or more resistors, a single unidirectional current path including a diode, or a pair of unidirectional current paths including diodes anti-parallel to each other. The first voltage drop circuit 316 is configured to have greater electrical resistance than the first switching device 312, so that current flows through the first switching device 312 and not through the first voltage drop circuit 316 when the first switching device is closed and is not faulted. When current flows through the first voltage drop circuit 316, a voltage drop above a threshold magnitude results, and is measurable by the first voltage sensor 126 in order to determine a fault of the first switching device.

The second connection 308 includes a second switching device 318 and a second voltage drop circuit 322, which are configured equivalently to the first connection 306, the first switching device 312 and the first voltage drop circuit 316. To fault test the first connection 306, the second switching device 318 is controlled by the detection controller 124 to open the second switching device 318. With the first switching device 312 open, detection of a voltage drop across the first voltage drop circuit 316 indicates current flow across the first voltage drop circuit 316, which corresponds to a fault of the first switching device 312. To fault test the second connection 308, the first switching device 312 is controlled by the detection controller 124 to open the first switching device 312. With the first switching device 312 open, detection of a voltage drop across the second voltage drop circuit 322 indicates current flow across the second voltage drop circuit 322, which corresponds to a fault of the second switching device 318.

Accordingly, in the system 300 the first connection 306 may include the first switching device 312 the first voltage drop circuit 316 in parallel with the first switching device 312, wherein the first switching device 312 is configured to allow current flow between the first node 102 and the second node 104 through the first switching device 312 when the first switching device 312 is enabled, and the first voltage drop circuit 316 is configured to allow current flow between the first node 102 and the second node 102 when the first switching device 312 is disabled. The second connection 308 includes the second switching device 318 and the second voltage drop circuit 322 in parallel with the second switching device 318, wherein the second switching device 318 is configured to allow current flow between the first node 102 and the second node 102 through the second switching device 318 when the second switching device 318 is enabled, and the second voltage drop circuit 322 is configured to allow current flow between the first node 102 and the second node 104 when the second switching device 316 is disabled. The fault detection circuit 124 is configured to test the first connection by detection of current flow along the second connection 308 while the second switching device 316 is disabled, and configured to test the second connection 308 by detection of current flow along the first connection 306 while the first switching device 312 is disabled.

In some implementations of the system 300, the fault detection circuit 124 is configured to output a signal indicative of a fault upon detection of current flow through one of the first voltage drop circuit 316 or the second voltage drop circuit 322. Current flow through the second voltage drop circuit 322 while the second switching device 318 is disabled indicates a fault of the first connection 306, and current flow though the first voltage drop circuit 316 while the first switching device 312 is disabled indicates a fault of the second connection 308. The fault detection circuit 124 may be configured to detect current flow through the second voltage drop circuit 322 by detection of a voltage drop across the second voltage drop circuit 322 and the fault detection circuit 124 is configured to detect current flow through the first voltage drop circuit 316 by detection of a voltage drop across the first voltage drop circuit 316. The first switching device 312 and the second switching device 318 may each include at least one of a relay or a transistor. The first voltage drop circuit 316 and the second voltage drop circuit 322 may each include at least one of a diode or a resistor.

Figure 4:
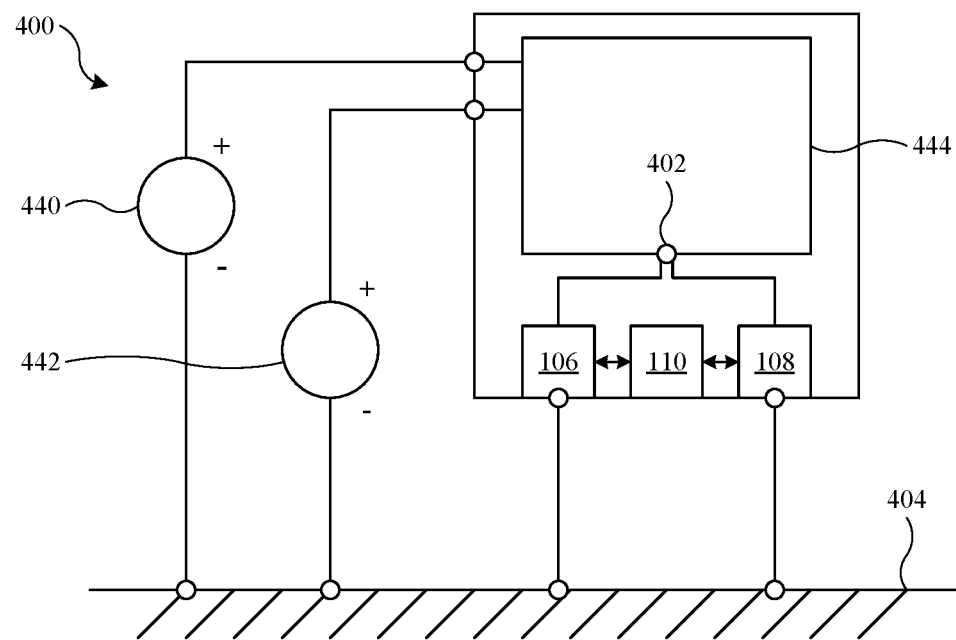
FIG. 4 is an illustration of a system for fault detection according to a fourth example.

FIG. 4 is a schematic illustration of a system 400 that includes the first connection 106, the second connection 108, and the fault detection circuit 110. A first voltage source 440 and a second voltage source 442 provide redundant power supply connections to a main circuit 444 of the system 400. The first connection 106 and the second connection 108 are connected between a grounding node 402 of the main circuit 444 and a ground 404, to provide redundant connections of the main circuit 444 to the ground 404. The fault detection circuit 110 operates to detect faults of the first connection 106 and the second connection 108 as previously described. Portions of the system 400 may alternatively be implemented in the manner described with respect to the system 200 or the system 300.

Figure 5:
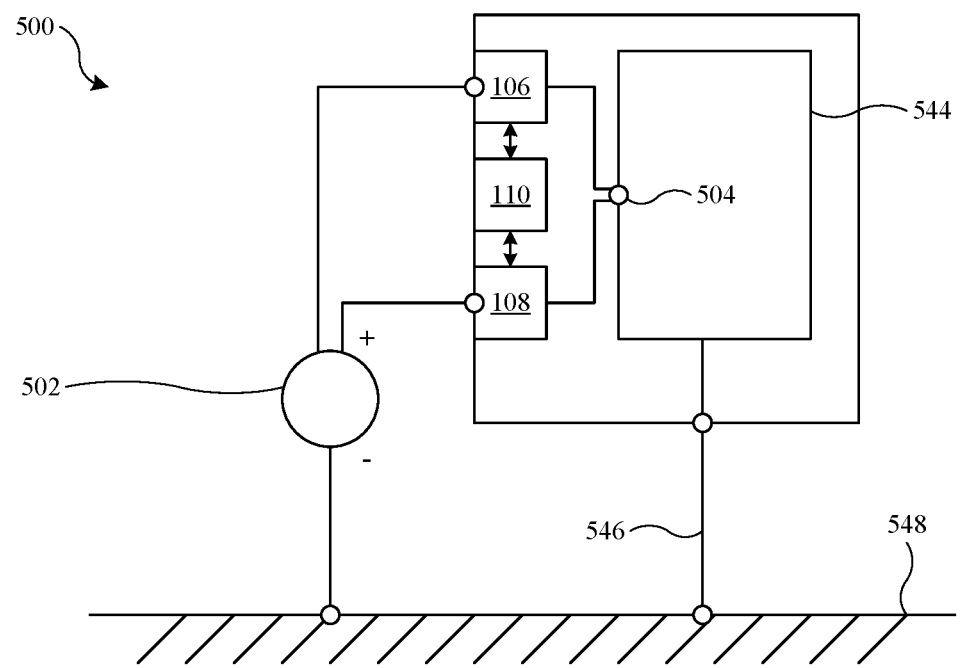
FIG. 5 is an illustration of a system for fault detection according to a fifth example.

FIG. 5 is a schematic illustration of a system 500 that includes the first connection 106, the second connection 108, and the fault detection circuit 110. A voltage source 502 supplies power to a source node 504 of a main circuit 544 of the system 500 through redundant power supply connections defined by the first connection 106 and the second connection 108, which are connected between the voltage source 502 and the source node 504. The main circuit 544 also has a ground connection 546 to a ground 548. The fault detection circuit 110 operates to detect faults of the first connection 106 and the second connection 108 as previously described. Portions of the system 500 may alternatively be implemented in the manner described with respect to the system 200 or the system 300.

The present technology may be implemented in the context of a system that includes the gathering and use of data available from various sources. As an example, such data may identify the user and include user-specific settings or preferences. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, a user profile may be established that stores user preference related information that allows operation of a device according to user preferences. Accordingly, use of such personal information data enhances the user's experience.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, systems incorporating the present technology can be configured to allow users to select to "opt in" or "opt out" of participation in the collection of personal information data during registration for services or anytime thereafter. In another example, users can select not to provide data regarding usage of specific applications. In yet another example, users can select to limit the length of time that application usage data is maintained or entirely prohibit the development of an application usage profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, information needed to operate a system may be determined each time the system is used, such as by asking a user to supply the information needed, and without subsequently storing the information or associating with the particular user.

What is claimed is:

1. A system, comprising:
   a first connection from a first node to a second node, the first connection including a first transistor and a first diode in parallel with the first transistor, wherein the first transistor is configured to allow current flow between the first node and the second node through the first transistor when the first transistor is enabled, and the first diode is configured to allow current flow between the first node and the second node when the first transistor is disabled;
   a second connection from the first node to the second node, the second connection including a second transistor and a second diode in parallel with the second transistor, wherein the second transistor is configured to allow current flow between the first node and the second node through the second transistor when the second transistor is enabled, and the second diode is configured to allow current flow between the first node and the second node when the second transistor is disabled; and
   a fault detection circuit configured to test the first connection by detection of current flow along the second connection while the second transistor is disabled, and configured to test the second connection by detection of current flow along the first connection while the first transistor is disabled.

2. The system of claim 1, wherein the fault detection circuit is configured to output a signal indicative of a fault upon detection of current flow through one of the first diode or the second diode.

3. The system of claim 1, wherein current flow through the second diode while the second transistor is disabled indicates a fault of the first connection, and current flow though the first diode while the first transistor is disabled indicates a fault of the second connection.

4. The system of claim 1, wherein the fault detection circuit is configured to detect current flow through the second diode by detection of a voltage drop across the second diode and the fault detection circuit is configured to detect current flow through the first diode by detection of a voltage drop across the first diode.

5. The system of claim 4, wherein the fault detection circuit is configured to output a signal indicative of a fault upon detection of a voltage drop in excess of 0.3 volts across one of the first diode or the second diode.

6. The system of claim 1, wherein the first transistor is a first MOSFET and the second transistor is a second MOSFET.

7. The system of claim 6, wherein the first diode is a first external diode, the second diode is a second external diode, the first MOSFET includes a first body diode that is anti-parallel to the first diode of the first connection and the second MOSFET includes a second body diode that is anti-parallel to the second diode of the second connection.

8. The system of claim 7, wherein the first body diode and the first external diode of the first MOSFET together allow bi-directional current flow between the first node and the second node along the first connection when the first MOSFET is disabled, and the second body diode and the second external diode of the second MOSFET together allow bi-directional current flow between the first node and the second node along the second connection when the second MOSFET is disabled.

9. The system of claim 1, wherein the first node is a grounding node of an external circuit, and the second node is a ground.

10. The system of claim 1, wherein the first node is a voltage source and the second node is a source node of an external circuit.

11. A system, comprising:
a first connection from a first node to a second node, the first connection including a first MOSFET having a first body diode, and a first external diode that is anti-parallel to the first body diode, wherein the first MOSFET is switchable between an enabled state, in which current flows through the first MOSFET between the first node and the second node, and a disabled state, in which current does not flow through the first MOSFET between the first node and the second node;
a second connection from the first node to the second node, the second connection including a second MOSFET having a second body diode, and a second external diode that is anti-parallel to the second body diode, wherein the second MOSFET is switchable between an enabled state, in which current flows through the second MOSFET between the first node and the second node, and a disabled state, in which current does not flow through the second MOSFET between the first node and the second node; and
a fault detection circuit configured to test the first connection by detection of a voltage drop having a magnitude in excess of a threshold value along the second connection when the second MOSFET is in the disabled state, and configured to test the second connection by detection a voltage drop having a magnitude in excess of the threshold value along the first connection when the first MOSFET is in the disabled state.

12. The system of claim 11, wherein the fault detection circuit is configured to output a signal indicative of a fault of the first connection upon detection of the voltage drop in excess of the threshold value along the second connection when the second MOSFET is in the disabled state, and configured to output a signal indicative of a fault of the second connection upon detection of the voltage drop in excess of the threshold value along the first connection when the first MOSFET is in the disabled state.

13. The system of claim 11, wherein the first body diode and the first external diode of the first MOSFET together allow bi-directional current flow between the first node and the second node along the first connection when the first MOSFET is disabled, and the second body diode and the second external diode of the second MOSFET together allow bi-directional current flow between the first node and the second node along the second connection when the second MOSFET is disabled.

14. The system of claim 11, wherein the first node is a grounding node of an external circuit, and the second node is a ground.

15. The system of claim 11, wherein the first node is a voltage source and the second node is a source node of an external circuit.

16. A method for detecting a fault of a first connection between a first node and a second node, the method comprising:
switching a transistor of a second connection between the first node and the second node from an enabled state to a disabled state;
determining that a current flow is present across a diode of the second connection while the transistor of the second connection is in the disabled state; and
in response to determining that the current flow is present, outputting a signal indicative of a fault of the first connection.

17. The method of claim 16, wherein determining that the current flow is present across the diode of the second connection while the transistor of the second connection is in the disabled state comprises detecting a voltage drop across the diode of the second connection while the transistor of the second connection is in the disabled state, the voltage drop having a magnitude in excess of a threshold value.

18. The method of claim 17, wherein the threshold value is 0.3 volts.

19. The method of claim 16, wherein the diode of the second connection is an external diode and the transistor includes a body diode that is connected anti-parallel to the external diode of the second connection.

20. The method of claim 16, wherein the transistor of the second connection is a MOSFET.

21. A system, comprising:
a first connection from a first node to a second node, the first connection including a first switching device and a first voltage drop circuit in parallel with the first switching device, wherein the first switching device is configured to allow current flow between the first node and the second node through the first switching device when the first switching device is enabled, and the first voltage drop circuit is configured to allow current flow between the first node and the second node when the first switching device is disabled;
a second connection from the first node to the second node, the second connection including a second switching device and a second voltage drop circuit in parallel with the second switching device, wherein the second switching device is configured to allow current flow between the first node and the second node through the second switching device when the second switching device is enabled, and the second voltage drop circuit is configured to allow current flow between the first node and the second node when the second switching device is disabled; and a fault detection circuit configured to test the first connection by detection of current flow along the second connection while the second switching device is disabled, and configured to test the second connection by detection of current flow along the first connection while the first switching device is disabled.

22. The system of claim 21, wherein:

the fault detection circuit is configured to output a signal indicative of a fault upon detection of current flow through one of the first voltage drop circuit or the second voltage drop circuit, current flow through the second voltage drop circuit while the second switching device is disabled indicates a fault of the first connection, and current flow though the first voltage drop circuit while the first switching device is disabled indicates a fault of the second connection, and the fault detection circuit is configured to detect current flow through the second voltage drop circuit by detection of a voltage drop across the second voltage drop circuit and the fault detection circuit is configured to detect current flow through the first voltage drop circuit by detection of a voltage drop across the first voltage drop circuit.

23. The system of claim 21, wherein the first switching device and the second switching device each include at least one of a relay or a transistor.

24. The system of claim 21, wherein the first voltage drop circuit and the second voltage drop circuit each include at least one of a diode or a resistor.

\* \* \* \* \*

UNITED STATES PATENT AND TRADEMARK OFFICE
CERTIFICATE OF CORRECTION

| | |
|---|---|
| PATENT NO. | : 11,808,820 B1 |
| APPLICATION NO. | : 17/878952 |
| DATED | : November 7, 2023 |
| INVENTOR(S) | : Stephen C. Sherbrook, Alvin K. Ng and Anthony Da Costa |

It is certified that error appears in the above-identified patent and that said Letters Patent is hereby corrected as shown below:

In the Specification

At Column 1, Line number 62, "detection a voltage" should be --detection of a voltage--.

In the Claims

At Column 15, Claim number 11, Line number 60, "detection a voltage" should be --detection of a voltage--.

Signed and Sealed this
Ninth Day of January, 2024

Katherine Kelly Vidal
*Director of the United States Patent and Trademark Office*